(12) United States Patent
Lin

(10) Patent No.: US 12,243,750 B2
(45) Date of Patent: Mar. 4, 2025

(54) GAS CURTAIN FOR SEMICONDUCTOR MANUFACTURING SYSTEM

(71) Applicant: Taiwan Semiconductor Manufacturing Co., Ltd., Hsinchu (TW)

(72) Inventor: Kent Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 353 days.

(21) Appl. No.: 17/459,369

(22) Filed: Aug. 27, 2021

(65) Prior Publication Data

US 2021/0391179 A1 Dec. 16, 2021

Related U.S. Application Data

(62) Division of application No. 16/600,054, filed on Oct. 11, 2019, now Pat. No. 11,145,517.
(Continued)

(51) Int. Cl.
*H01L 21/3065* (2006.01)
*H01J 37/32* (2006.01)
(Continued)

(52) U.S. Cl.
CPC ...... *H01L 21/3065* (2013.01); *H01J 37/3244* (2013.01); *H01J 37/32449* (2013.01);
(Continued)

(58) Field of Classification Search
CPC .......... H01L 21/3065; H01L 21/31116; H01L 21/67126; H01L 21/0262; H01L 21/6719; H01L 21/67742; H01L 21/67248; H01L 21/67017; H01L 21/67253; H01L 21/67109; H01L 21/67115; H01L 21/67184; H01L 21/67207; H01L 22/20; H01L 21/67155; H01L 21/68771;
(Continued)

(56) References Cited

U.S. PATENT DOCUMENTS 5,997,588 A 12/1999 Goodwin et al.
6,328,221 B1 * 12/2001 Moore .............. C23C 16/45563
118/715

(Continued)

FOREIGN PATENT DOCUMENTS

| CN | 103805964 A | 5/2014 |
| TW | 201820452 A | 6/2018 |
| WO | WO-9714179 A1 | 4/1997 |

*Primary Examiner* — Rudy Zervigon
(74) *Attorney, Agent, or Firm* — Sterne, Kessler, Goldstein & Fox P.L.L.C.

(57) ABSTRACT

The present disclosure relates to a semiconductor device manufacturing system. The semiconductor device manufacturing system can include a chamber, a slit valve configured to provide access to the chamber, a chuck disposed in the chamber and configured to hold a substrate, and a gas curtain device disposed between the chuck and the slit valve and configured to flow an inert gas to form a gas curtain. An example benefit of the gas curtain is to block an inflow of oxygen or moisture from entering the chamber to ensure a yield and reliability of the semiconductor manufacturing processes conducted in the chamber.

20 Claims, 5 Drawing Sheets

Related U.S. Application Data

(60) Provisional application No. 62/752,221, filed on Oct. 29, 2018.

(51) Int. Cl.
    *H01L 21/311*     (2006.01)
    *H01L 21/67*     (2006.01)
    *H01L 21/02*     (2006.01)

(52) U.S. Cl.
    CPC .. *H01J 37/32743* (2013.01); *H01J 37/32788* (2013.01); *H01L 21/31116* (2013.01); *H01L 21/67126* (2013.01); *H01L 21/0262* (2013.01)

(58) Field of Classification Search
    CPC ... H01L 22/30; H01L 21/67242; H01L 22/12; H01L 21/67276; H01L 21/67748; H01L 21/6773; H01L 21/67778; H01L 21/67028; H01L 21/68707; H01L 21/67772; H01L 21/67201; H01L 21/67167; H01L 21/67196; H01J 37/3244; H01J 37/32449; H01J 37/32743; H01J 37/32788; H01J 37/32899; H01J 37/32834; H01J 37/3488; C23C 14/568; C23C 14/24; C23C 14/541; C23C 16/4405; C23C 14/35; C23C 14/54; C23C 14/16; C23C 14/0021; C23C 28/32; C23C 14/28; C23C 28/34; C23C 14/225; C23C 14/165; C23C 28/322; C23C 14/56; C23C 14/042; C23C 28/00; C23C 14/50; G06T 7/0006; G03F 7/7065; G03F 7/70675; G03F 7/70625; G01N 21/9501; H10N 60/0912; B24C 1/003; E06C 7/165; E06C 7/48; E06C 1/34; E06C 7/14
    USPC ........................ 118/719; 156/345.31, 345.32
    See application file for complete search history.

(56) References Cited

U.S. PATENT DOCUMENTS

| | | | |
|---|---|---|---|
| 6,673,196 | B1 | 1/2004 | Oyabu |
| 11,145,517 | B2* | 10/2021 | Lin ................... H01J 37/32788 |
| 11,331,700 | B2* | 5/2022 | Ko .......................... H10K 71/00 |
| 2003/0044742 | A1* | 3/2003 | Wang ................ H01L 21/67748 432/5 |
| 2004/0166697 | A1 | 8/2004 | Wang et al. |
| 2010/0236478 | A1 | 9/2010 | Miyashita et al. |
| 2012/0031333 | A1 | 2/2012 | Kurita et al. |
| 2014/0123900 | A1 | 5/2014 | Wang et al. |
| 2016/0169766 | A1* | 6/2016 | Ishibashi ........... H01L 21/67098 414/217 |
| 2017/0253968 | A1 | 9/2017 | Yahata |
| 2022/0301893 | A1* | 9/2022 | Wei ................... H01L 21/67742 |

* cited by examiner

GAS CURTAIN FOR SEMICONDUCTOR MANUFACTURING SYSTEM

RELATED APPLICATIONS

This application is a divisional of U.S. Non-Provisional patent application Ser. No. 16/600,054, filed on Oct. 11, 2019, titled "Gas Curtain for Semiconductor Manufacturing System," which claims the benefit of U.S. Provisional Patent Application No. 62/752,221, filed on Oct. 29, 2018, titled "Semiconductor Manufacturing Apparatus and Methods Thereof." The entire contents of the aforementioned applications are incorporated by reference herein in their entireties.

BACKGROUND

With advances in semiconductor technology, there has been increasing demand for semiconductor devices with higher performance and lower costs. To meet these demands, the semiconductor industry continues to impose strict requirements on device fabrication yield and reliability. Such requirements has driven the demands to further optimize the design and architecture of semiconductor device manufacturing systems.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
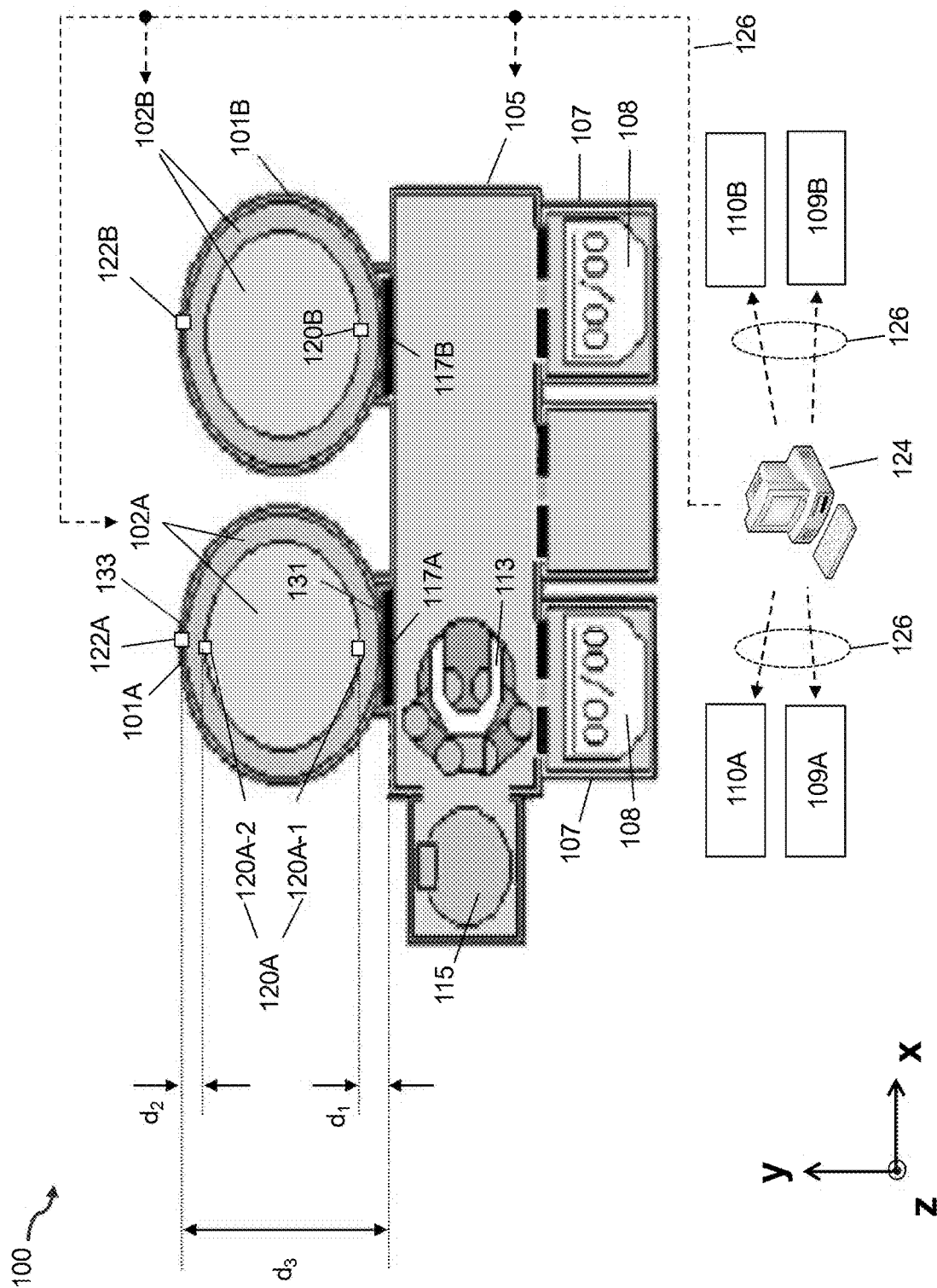
FIG. 1 is a plan view of a semiconductor device manufacturing system, according to some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Spatially relative terms, such as "beneath," "underlying," "underneath," "below," "lower," "above," "upper," "lower," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value).

As used herein, the term "vertical" means nominally perpendicular to a surface, such as a substrate's surface or a stage's surface.

Semiconductor substrates (e.g., semiconductor wafers) are subjected to different device manufacturing processes (e.g., wet etching, dry etching, ashing, stripping, metal plating, epitaxy, and/or chemical mechanical polishing) in different processing chambers of processing modules of semiconductor device manufacturing systems during the fabrication of semiconductor devices. The different processing modules can be arranged in a cluster around a central, automated handling unit. Such clusters of processing modules are often referred as cluster tools. The central automated handling unit can include transfer modules that can be configured to transfer the wafers between different processing chambers and/or between processing chambers and wafer storage devices. The wafers are typically transported through transfer modules (sometimes referred as load lock modules) and temporarily stored in batches in the wafer storage devices during intervals between the different processes.

For example, the transfer module can include a wafer holder that can hold a number of individual wafers and a mechanical transfer mechanism (e.g., a robotic arm) to move the wafers to and from the processing chambers. Prior to the transfer of the wafers, a slit valve between the transfer module and the processing chambers can be opened. One or more of the wafers can then be mechanically transferred to the processing chamber using, for example, a robotic arm of the transfer module. After the transfer of the wafers, the processing chambers can be configured to provide an environment filled with a process gas or a vacuum environment to conduct the different processes on the wafers.

Nevertheless, during the transfer of the wafers, a residue gas (e.g., oxygen or moisture) from the transfer module can flow into the processing chambers. Such residue gas can either disrupt a desired vacuum level or compromise a purity of the processing gas in the processing chamber, thus jeopardizing an overall yield and reliability of the manufactured semiconductor devices The present disclosure provides example systems and methods for improving the yield and reliability of manufacturing semiconductor devices. In some embodiments, a processing chamber of a processing module of the semiconductor device manufacturing system can be configured to provide a gas curtain to block or reduce an inflow of a residue gas from outside the processing chamber. In some embodiments, the processing chamber can include a slit valve and a gas hole disposed adjacent to the slit valve. An inert gas outputting from the gas hole can form a localized gas stream (e.g., gas curtain) adjacent to the slit valve to block the inflow of residue gas from entering the processing chamber. In some embodiments, an amount of residue gas flowing into the processing chamber can be reduced by the gas curtain by about 85% to about 99%. As a result, the amount of residue gas flown into the processing chamber can be drastically reduced, thus ensuring the yield and reliability of semiconductor manufacturing processes conducted in the processing chamber.

FIG. 1 shows a plan view of a semiconductor device manufacturing system 100, according to some embodiments. Semiconductor device manufacturing system 100 can include processing modules 101A-101B, a transfer module 105, loading ports 107, and a control system 124.

Each of loading ports 107 can accommodate a substrate storage device 108 (sometimes referred as front opening unified pod (FOUP)). Substrate storage device 108 can be configured for temporarily storing a batch of wafers in a controlled environment during intervals between the different processes in processing modules 101A-101B. Substrate storage device 108 can include a purging system (not shown) to reduce humidity and contamination from the environment. The purging system can include one or more gas inlet tubes (not shown) configured to supply a purging gas into substrate storage device 108. The purging systems can also include one or more outlets (not shown) configured to extract the purging gas from substrate storage device 108.

Transfer module 105 can be configured to provide a transfer conduit to transfer substrates between loading ports 107 and processing modules 101A-101B. Even though FIG. 1 illustrates a common transfer module (e.g., transfer module 105) coupled to both processing modules 101A and 101B, system 100 can have multiple of transfer modules 105 that respectively connect to each of processing modules 101A and 101B. Transfer module 105 can be configured to transfer substrates at atmospheric pressure. For example, transfer module 105 can be configured to transfer substrates between loading ports 107 and processing modules 101A-101B, while loading ports 107, transfer module 105, and processing modules 101A-101B can be at atmospheric pressure. In some embodiments, transfer module 105 can be configured to transfer substrates at a vacuum environment. For example, transfer module 105 can be configured to provide a pressure level (e.g., $10^{-2}$ torr) that is similar to that in processing chambers 102A-102B. In response that transfer module 105 and processing chambers 102A-102B have similar pressure level (e.g., $10^{-2}$ torr or 760 torr), transfer module 105 can deliver substrates in or out processing chambers 102A-102B.

Transfer module 105 can include a robotic arm 113 configured to transfer the substrates between loading ports 107 and processing modules 101A-101B. For example, robotic arm 113 can be configured to transfer one or more substrates from wafer storage device 108 to processing module 101A and/or 101B. In some embodiments, robotic arm 113 can be configured as a substrate holder to temporarily hold the substrates. In some embodiments, transfer module 105 can further include substrate orientation stage 115 configured to adjust an orientation of each substrate towards a direction in favor of a semiconductor manufacturing process to be performed on the substrate, where an outcome of the semiconductor manufacturing process (e.g., epitaxial-grown layer's shape and substrate annealing uniformity) depends on the substrate's crystallinity or directionality. In some embodiments, robotic arm 113 can be configured to transfer substrates between substrate orientation stage 115, loading ports 107, and processing modules 101A-101B. For example, one or more of the batch of substrates in wafer storage device 108 can be transferred by robotic arm 113 to substrate orientation stage 115 prior to being transferred to processing modules 101A and/or 101B.

Processing modules 101A and 101B can include processing chambers 102A-102B and slit valves 117A-117B, respectively. Even though two processing modules 101A-101B are shown, system 100 can have less than or more than two processing modules similar to processing modules 101A-101B. Each of processing chambers 102A-102B can be configured to provide a working environment to conduct semiconductor manufacturing processes on substrates (not shown), where the working environment can be a vacuum environment or an environment filled with a processing gas. For example, processing chambers 102A-102B can be configured to filled with a forming gas (e.g., a mixture of nitrogen/hydrogen gas) to conduct an annealing process on the substrates. As another example, processing chambers 102A-102B can be configured to provide an environment with a vacuum pressure below $10^{-4}$ torr via a vacuum pump (not shown in FIG. 1) to conduct a plasma etching process on the substrates.

In some embodiments, the semiconductor manufacturing processes conducted in processing chambers 102A-102B can include a thermal process, such as rapid thermal annealing (RTA); an oxidation process, such as thermal oxidation or ozone irradiation process; deposition processes, such as molecular beam epitaxy (MBE), chemical vapor deposition (CVD), plasma-enhanced chemical vapor deposition (PECVD), low-pressure chemical vapor deposition (LPCVD), electrochemical deposition (ECD), physical vapor deposition (PVD), atomic layer deposition (ALD), metal organic chemical vapor deposition (MOCVD), sputtering, thermal evaporation, e-beam evaporation, or other deposition processes; etching processes, such as dry etching, reactive ion etching (RIE), inductively coupled plasma etching (ICP), or ion milling; microscopy, such as scanning electron microscopy (SEM), and transmission electron microscopy (TEM); or any combination thereof.

In some embodiments, each of processing chambers 102A-102B can further include ports (not shown in FIG. 1) for installing an auxiliary manufacturing apparatus (not shown in FIG. 1) or for coupling to other vacuum chamber(s) (not shown in FIG. 1). During the semiconductor manufacturing processes, the ports of processing chambers 102A-102B can be sealed with vacuum flanges equipped with knife edges or o-rings to ensure maintenance of vacuum pressure level of the processing chamber.

Slit valves 117A-117B can be configured to provide access between processing chambers 102A-102B and transfer module 105. For example, slit valves 117A-117B can open to provide access between transfer module 105 and processing chambers 102A-102B, when transfer modules 105 and processing chambers 102A-102B are under a similar pressure level (e.g., atmospheric environment or a vacuum environment). Slit valves 117A-117B can be further configured to isolate processing chambers 102A-102B from transfer module 105 during the semiconductor manufacturing processes conducted in processing chambers 102A-102B (e.g., slit valves 117A-117B can be closed.)

In some embodiments, processing modules 101A-101B can further include gas curtain devices 120A-120B, gas outlet ports 122A-122B, gas supply systems 109A-109B, and gas extraction systems 110A-110B, respectively. Gas curtain devices 120A-120B can be configured to form a localized gas stream (e.g., gas curtain) in a nearby space. For example, gas curtain devices 120A-120B can be placed adjacent to slit valves 117A-117B to flow an inert gas (e.g., nitrogen or argon) to respectively form gas curtains at or near slit valves 117A-117B. Such gas curtain can impede an inflow of residue gas (e.g., oxygen or moisture) from transfer module 105 to processing chambers 102A-102B, during a substrate transfer operation between transfer module 105 and processing chambers 102A-102B. To effectively block such inflow of residue gas, gas curtain devices 120A-120B need to be configured to flow the inert gas above a threshold flow rate (e.g., to form a strong gas curtain). Namely, the inert gas flowing below the threshold flow rate (e.g., a weak gas curtain) cannot sufficiently block the inflow of the residue gas during the substrate transfer operation. In some embodiments, the threshold flow rate provided by gas curtain devices 120A-120B that are required to block the inflow of residue gas can be equal to or larger than about 1 standard liter per minute (slm), equal to or larger than about 5 slm, equal to or larger than about 10 slm, equal to or larger than about 25 slm, equal to or larger than about 50 slm.

In some embodiments, each of processing modules 101A-101B can include multiple gas curtain devices 120A-120B. For example, as illustrated in FIG. 1, processing module 101A can include gas curtain devices 120A-1 and 120A-2 that are placed at different portions of processing chamber 102A. In some embodiments, gas curtain devices 120A-1 and 120A-2 can be placed at different interior portions of processing chamber 102A. In some embodiments, gas curtain device 120A-1 can be placed adjacent to processing chamber 102A's front side 131 and gas curtain device 120A-2 can be placed adjacent to processing chamber 102A's rear side 133, where front side 131 is adjacent to slit valve 117A, and rear side 133 is opposite to front side 131 and away from slit valve 117A. In some embodiments, gas curtain device 120A-1 can be placed adjacent to processing chamber 102A's front side 131, where a ratio of a horizontal distance $d_1$ (e.g., distance in y-direction between gas curtain device 120A-1 and slit valve 117A) to a horizontal distance $d_3$ (e.g., distance in y-direction between slit valve 117A and rear side 133) can be between about 0.02 and about 1.00. In some embodiments, gas curtain device 120A-2 can be placed adjacent to processing chamber 102A's rear side 133, where a ratio of a horizontal distance $d_2$ (e.g., distance in y-direction between gas curtain device 120A-2 and rear side 133) to a horizontal distance $d_3$ can be between about 0.03 and about 1.00. In some embodiments, gas curtain devices 120A-120B can be placed in any portion of processing modules 101A-101B. In some embodiments, gas curtain devices 120A-120B can be placed at any portion of processing chambers 102A-102B.

Gas supply systems 109A-109B can be connected to gas curtain devices 120A-120B and can be configured to as a supply of the inert gas for gas curtain devices 120A-120B to form gas curtains. In some embodiments, gas supply systems 109A-109B can include an inert gas source (e.g., a cylinder that stores inert gas), a gas conduit, and a gas flow controller, such as a mass flow controller (all not shown in FIG. 1). The gas conduit can be connected to gas curtain devices 120A-120B to transport the inert gas, and the gas flow controller can regulate the inert gas flow rate in the gas conduit. In some embodiments, the gas flow controller can be configured to control the inert gas flow rate provided by gas curtain devices 120A-120B.

In some embodiments, gas curtain devices 120A-120B can be openings 120A-120B through sidewalls of processing chambers 102A-102B, where gas supply systems 109A-109B can be connected to openings 120A-120B to provide the inert gas to form the gas curtains.

Gas outlet ports 122A-122B can be openings through sidewalls of processing chambers 102A-102B. In some embodiments, gas outlet ports 122A-122B can be formed at rear sides of processing chambers 102A-102B (e.g., processing chamber 102A's rear side 133). Gas outlet ports 122A-122B can be configured to exhaust gas inside processing chambers 102A-102B. For example, gas outlet ports 122A-122B can be connected to gas extraction systems 110A-110B, where gas in processing chambers 102A-102B can be exhausted by gas extraction systems 110A-110B through gas outlet ports 122A-122B. In some embodiments, gas extraction systems 110A-110B can be configured to pump down processing chambers 102A-102B through gas outlet ports 122A-122B to create a vacuum environment in processing chambers 102A-102B. Gas extraction systems 110A-110B can include a vacuum pump configured to extract gas from processing chambers 102A-102B, a gas conduit configured to transport the gas extracted from processing chambers 102A-102B, and a gas flow controller configured to control a flow rate in the gas conduit, where the flow rate can be associated an exhaust rate of extracting gas from processing chambers 102A-102B (all not shown in FIG. 1). The gas conduit can be connected to the vacuum pump and/or gas outlet ports 122A-122B. In some embodiments, gas extraction systems 110A-110B can further include a valve (not shown in FIG. 1) to allow/block gas extraction systems 110A-110B to exhaust gas from processing chambers 102A-102B.

In some embodiments, gas supply systems 109A-109B and gas extraction systems 110A-110B can be a combined system (not shown in FIG. 1), and not separate systems as illustrated in FIG. 1.

Control system 124 can include any suitable computer system (e.g., workstation and portable electronic device) configured to store/execute programs for performing/monitoring various operations of loading ports 107, transfer module 105, and processing modules 101A-101B. In some embodiments, control system 124 can control/instruct transfer module 105 to deliver a substrate. In some embodiments, control system 124 can control/instruct processing modules 101A-101B to provide a processing gas, adjust processing chamber 102A-102B's pressure, and adjust a position of slit valves 117A-117B. In some embodiments, control system 124 can control/instruct gas supply systems 109A-109B and gas curtain devices 120A-120B to form gas curtains in processing chambers 102A-102B. The above noted operations of control system 124 are illustrative and are not intended to be limiting.

Control system 124 can be configured to communicate (e.g., send instructions and receive data) with other components of system 100 (e.g., loading ports 107, transfer module 105, and processing modules 101A-101B) via communication links 126. Communication links 126 can include any suitable network connection mechanism, such as a communication bus, a local area network (LAN), and/or a WiFi network. In some embodiments, control system 124 can update the instructions or the stored programs based on the data received from other components of system 100 via communication link 126.

Figure 2:
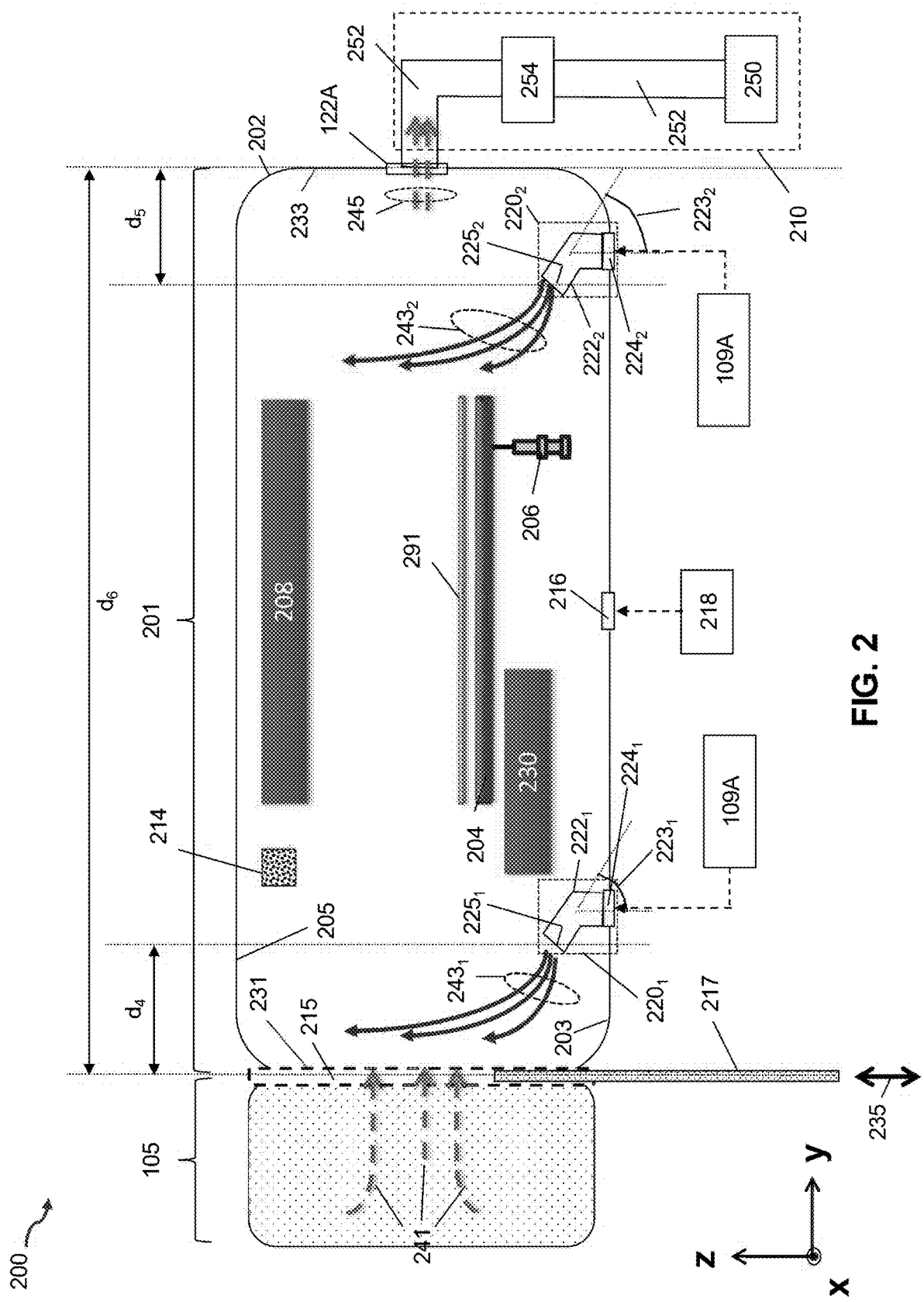
FIG. 2 is a side view of a semiconductor device manufacturing system, according to some embodiments.

FIG. 2 shows a side view of semiconductor device manufacturing system 200, according to some embodiments. Semiconductor device manufacturing system 200 can be an embodiment of semiconductor device manufacturing system 100. The discussion of semiconductor device manufacturing system 100 applies to semiconductor device manufacturing system 200 unless mentioned otherwise. Semiconductor device manufacturing system 200 can include transfer module 105 and a processing module 201. The discussion of processing module 101A (and/or processing module 101B) applies to processing module 201, unless mentioned otherwise. Further, the discussion of elements with the same annotations in FIGS. 1 and 2 applies to each other unless mentioned otherwise.

Processing module 201 can include a processing chamber 202, a slit valve 217, one or more gas curtain device 220, gas supply system 109A coupled to gas curtain devices 220, gas outlet port 122A, and a gas extraction system 210 coupled to gas outlet port 122A. The discussion of processing chamber 102A, slit valve 117A, gas curtain device 120A, and gas extraction system 110A respectively applies to processing chamber 202, slit valve 217, gas curtain device 220, and gas extraction system 210 unless mentioned otherwise. Processing chamber 202 can be coupled to transfer module 105 through slit valve 217. As shown in FIG. 2, slit valve 217 can be configured to move along vertical directions 235 (e.g., ±z-direction) to allow the access of processing chamber 202. For example, slit valve 217 can be configured to be opened to form a space 215 to allowed the substrates being delivered along a horizontal direction (e.g., y-direction) from transfer module 105 to processing chamber 202. In some embodiments, an inflow 241 of residue gas (e.g., oxygen from transfer module 105 under atmospheric environment) can flow into processing chamber 202 through space 215, in response to slit valve 217 being opened to allow delivering the substrates into processing chamber 202.

Gas curtain device 220 can be configured to form a localized gas stream 243 (e.g., gas curtain 243) to block inflow 241 from entering processing chamber 202. Gas curtain device 220 can be placed in any portions of processing chamber 202. For example, in referring to FIG. 2, semiconductor device manufacturing system 200 can include two gas curtain devices 220 (e.g., gas curtain devices $220_1$ and $220_2$), where gas curtain device $220_1$ can be placed adjacent to processing chamber 202's front side 231 (e.g., adjacent to slit valve 217) to form gas curtain $243_1$ and gas curtain device $220_2$ can be placed adjacent to processing chamber 202's rear side 233 (e.g., opposite to front side 231, away from slit valve 217) to form gas curtain $243_2$. Although FIG. 2 illustrates two gas curtain devices 220 (e.g., gas curtain device $220_1$ and $220_2$) to generate two gas curtains 243 (e.g., gas curtains $243_1$ and $243_2$), semiconductor device manufacturing system 200 can include any number of gas curtain devices 220 to generate any number of gas curtains 243. In some embodiments, a ratio of a horizontal distance $d_4$ (e.g., distance in y-direction between gas curtain device $220_1$'s outlet $225_1$ and slit valve 217) to a horizontal distance $d_6$ (e.g., distance in y-direction between slit valve 217 and rear side 233) can be between about 0.02 and about 1.00. In some embodiments, a ratio of a horizontal distance $d_5$ (e.g., distance in y-direction between gas curtain device $220_2$'s outlet $225_2$ and rear side 233) to a horizontal distance $d_6$ can be between about 0.03 and about 1.00.

Gas curtain devices $220_1$ and $220_2$ can include openings $224_1$ and $224_2$ formed through sidewalls of processing chamber 202. In some embodiments, openings $224_1$ and $224_2$ can respectively represent gas curtain devices' outlets (not shown in FIG. 2). Gas supply system 109A can be coupled to openings $224_1$ and $224_2$ to provide an inert gas (e.g., nitrogen or argon) to form gas curtains $243_1$ and $243_2$ in processing chamber 202. The black dash lines from gas supply system 109A to openings $224_1$ and $224_2$ illustrate the gas supply lines. In some embodiments, gas supply system 109A can include a gas flow controller (e.g., mass flow controller; not shown in FIG. 2) to control a supply (e.g., flow rate) of the inert gas in the gas supply lines for forming gas curtains $243_1$ and $243_2$. Even though one gas supply system 109A is shared by openings $224_1$ and $224_2$ as shown in FIG. 2, each of gas curtain devices $220_1$ and $220_2$ can be individually connected to a separate gas supply system 109A via openings (e.g., openings $224_1$ and $224_2$).

In some embodiments, in referring to FIG. 2, openings $224_1$ and $224_2$ can be respectively formed horizontally (e.g., in y-direction) adjacent to slit valve 217 and processing chamber 202's rear side 233. The above discussion of the ratios between horizontal distances $d_4$-$d_6$ can be applied here. For example, a horizontal distance $d_4$ can represent a separation between opening $224_1$ and slit valve 217, a horizontal distance $d_5$ can represent a separation between opening $224_2$ and rear side 233, and a horizontal distance $d_6$ can represent a separation between slit valve 217 and rear side 233. In some embodiments, a ratio of $d_4$ to $d_6$ can be between about 0.02 and about 1.00. In some embodiments, a ratio of $d_5$ to $d_6$ can be between about 0.03 and about 1.00. In some embodiments, both openings $224_1$ and $224_2$ can be formed at bottom portion sidewall 203. In some embodiments, both openings $224_1$ and $224_2$ can be formed at top portion sidewall 205. In some embodiments, one of openings $224_1$ and $224_2$ can be formed at bottom portion sidewall 203, while the other opening can be formed at top portion sidewall 205. In some embodiments, each of openings $224_1$ and $224_2$ can be formed at any sidewall portion of processing chamber 202.

In some embodiments, to effectively block inflow 241, a size of openings $224_1$ and $224_2$ are required to be larger than a threshold to allow a sufficient amount of inert gas to pass through to form strong gas curtains $243_1$ and $243_2$. In some embodiments, size of openings $224_1$ and $224_2$ can be equal to or larger than 3 mm to form gas curtains $243_1$ and $243_2$ that are capable to block inflow 241 from entering processing chamber 202.

In some embodiments, gas curtain devices $220_1$ and $220_2$ can further include gas conduits $222_1$ and $222_2$ connected to openings $224_1$ and $224_2$. The inert gas provided by gas supply system 109A can be outputted from gas conduit $222_1$'s outlet $225_1$ and gas conduit $222_2$'s outlet $225_2$ to respectively form gas curtains $243_1$ and $243_2$ in processing chamber 202. Gas conduits $222_1$ and $222_2$ can be configured to direct the inert gas to a desired location to effectively block inflow 241 (e.g., adjacent to slit valve 217). Gas conduits $222_1$ and $222_2$ can be further configured to direct the inert gas to flow towards a desired direction. For example, the inert gas can be directed by gas conduits $222_1$ and $222_2$ to form vertical gas curtain $243_1$ and $243_2$ flowing from processing chamber 202's bottom portion sidewall 203 towards processing chambers 202's top portion sidewall 205. In some embodiments, the inert gas can be directed by gas conduits $222_1$ and $222_2$ to form vertical gas curtain $243_1$ and $243_2$ flowing from a lower portion of space 215 to an upper portion of space 215. In some embodiments, outlets $225_1$ and $225_2$ can be parallel to processing chamber 202's bottom sidewall. In some embodiments, gas conduits $222_1$ and $222_2$ can be tilted gas conduits, where acute angles $223_1$ and $223_2$ between processing chamber 202's bottom sidewall and outlets $225_1$ and $225_2$ can be in a range between about 0 degrees and about 45 degrees or between about 0 degrees and about 90 degrees. In some embodiments, acute angles $223_1$ and $223_2$ can be different from each other.

In some embodiments, gas conduits $222_1$ and $222_2$ can be made of a metallic material, a plastic material, a polymeric material (e.g., polycarbonate), a rubber, or Teflon. In some embodiments, to effectively block inflow 241, size of outlets $225_1$ and $225_2$ needs to be larger than a threshold to allow enough inert gas passing through to form strong gas curtains $243_1$ and $243_2$. In some embodiments, a size of outlets $225_1$ and $225_2$ can be equal to or larger than 3 mm to form gas curtains $243_1$ and $243_2$ that are capable to block inflow 241 from entering processing chamber 202.

Gas extraction system 210 can be configured to exhaust gas from processing chamber 202. For example, gas extraction system 210 can be configured to extract gas outflow 245 from processing chamber 202 through gas outlet port 122A, where gas outflow 245 can include any gas (e.g., a processing gas, an inert gas, or a residue gas associated with inflow 241, such as oxygen or moisture) in processing chamber 202. In some embodiments, gas outlet port 122A can be formed at rear side 233 (e.g., opposite to front side 231, opposite to slit valve 217). Gas extraction system 210 can include a gas conduit 252 coupled to gas outlet port 122A, and a vacuum pump 250 coupled to gas conduit 252. Vacuum pump 250 can be configured to extract gas outflow 245 from processing chamber 202. Gas extraction system 210 can further include a valve 254 configured to allow or block vacuum pump 250 to extract gas outflow 245. For example, valve 254 can be opened to allow vacuum pump to extract gas outflow 245 from processing chamber 202. In some embodiments, valve 254 can be closed to prevent gas curtain 243 from leaking towards gas outlet port 122A. In some embodiments, gas extraction system 210 can also include a gas flow controller (not shown in FIG. 2), where the gas flow controller can control a flow rate of gas outflow 245 in gas conduit 252.

As previously discussed with respect to processing chambers 102A-102B, processing chamber 202 can be configured to provide a working environment to conduct various semiconductor manufacturing processes, where gas curtain 243 can block/reduce inflow 241 to improve the yield and reliability of the semiconductor manufacturing processes conducted in processing chamber 202. For example, as shown in FIG. 2, processing chamber 202 can be configured to provide a working environment to conduct a thermal annealing process on a substrate 291. Since inflow 241 can be blocked or reduced by gas curtain 243, the thermal annealing process conducted in processing chamber 202 can be less subjective to the contamination introduced by inflow 241, thus resulting in improved yield and reliability. The above noted example is illustrative for the benefit of gas curtain 243 generated by gas curtain device 220 and is not intended to limit the semiconductor manufacturing processes that can be performed in processing chamber 202.

In some embodiments, referring to FIG. 2, a thermal annealing process can be conducted on substrate 291 in processing chamber 202, where processing module 201 can include a chuck 204, a temperature gauge 206 configured to monitor chuck 204's temperature, a processing gas inlet port 216 formed through processing chamber 202's sidewall, a processing gas supply system 218 coupled to processing gas inlet port 216, an irradiation source 208 configured to provide a thermal source, and a reflector 230 configured to reflect irradiance from irradiation source 208. Chuck 204 can be configured to hold substrate 291 and can be placed in any portion of processing chamber 202. In some embodiments, chuck 204 can be positioned between slit valve 217 and gas outlet port 122A. In some embodiments, gas curtain device $220_1$ can be positioned between slit valve 217 and chuck 204, and gas curtain device $220_2$ can be positioned between chuck 204 and gas outlet port 122A. Substrate 291 can be placed over chuck 204 with one side facing irradiation source 208 and the other side facing reflector 230. Irradiation generated by irradiation source 208 and reflected by reflector 230 can heat substrate 291 for conducting the thermal annealing process. Processing gas supply system 218 can be configured to provide a processing gas (e.g., nitrogen or forming gas) to processing chamber 202 through processing gas inlet port 216. The black dash lines connecting processing gas inlet port 216 and processing gas supply system 218 can represent the processing gas's supply lines. In some embodiments, processing gas inlet port 216 can be formed through processing chamber 202's sidewall portions that are vertically below chuck 204. In some embodiments, openings $224_1$ and $224_2$ of gas curtain device 220 can be formed through processing chamber 202's sidewall portions that are vertically (e.g., in a z-direction) below chuck 204.

In some embodiments, processing module 201 can further include a gas detector 214 configured to detect a residue gas trace in processing chamber 202. For example, gas detector 214 can be configured to monitor an oxygen trace in processing chamber 202 over a range of about 0.1 parts per million (ppm) to 10,000 ppm. In some embodiments, gas detector 214 can be further configured to monitor a moisture trace in processing chamber over a range of about 0.1 ppm to about 10,000 ppm. Gas detector 214 can be placed in any portion of processing chamber 202. For example, gas detector 214 can be positioned adjacent to slit valve 217 as illustrated in FIG. 2. Further, gas detector 214 can be configured to communicate with control system 124 or other computer system to report the detected residue gas trace. Based on the disclosure herein, other species and detection ranges of residue gas for gas detector 214 are within the scope and spirit of this disclosure.

In some embodiments, in addition to the thermal annealing process, other semiconductor manufacturing processes can be conducted on substrate 291 in processing chamber 202, where one or more the previously described chuck 204, temperature gauge 206, processing gas inlet port 216, processing gas supply system 218, irradiation source 208, and reflector 230 can be included in processing module 202 to conduct the other semiconductor manufacturing processes.

Figure 3:
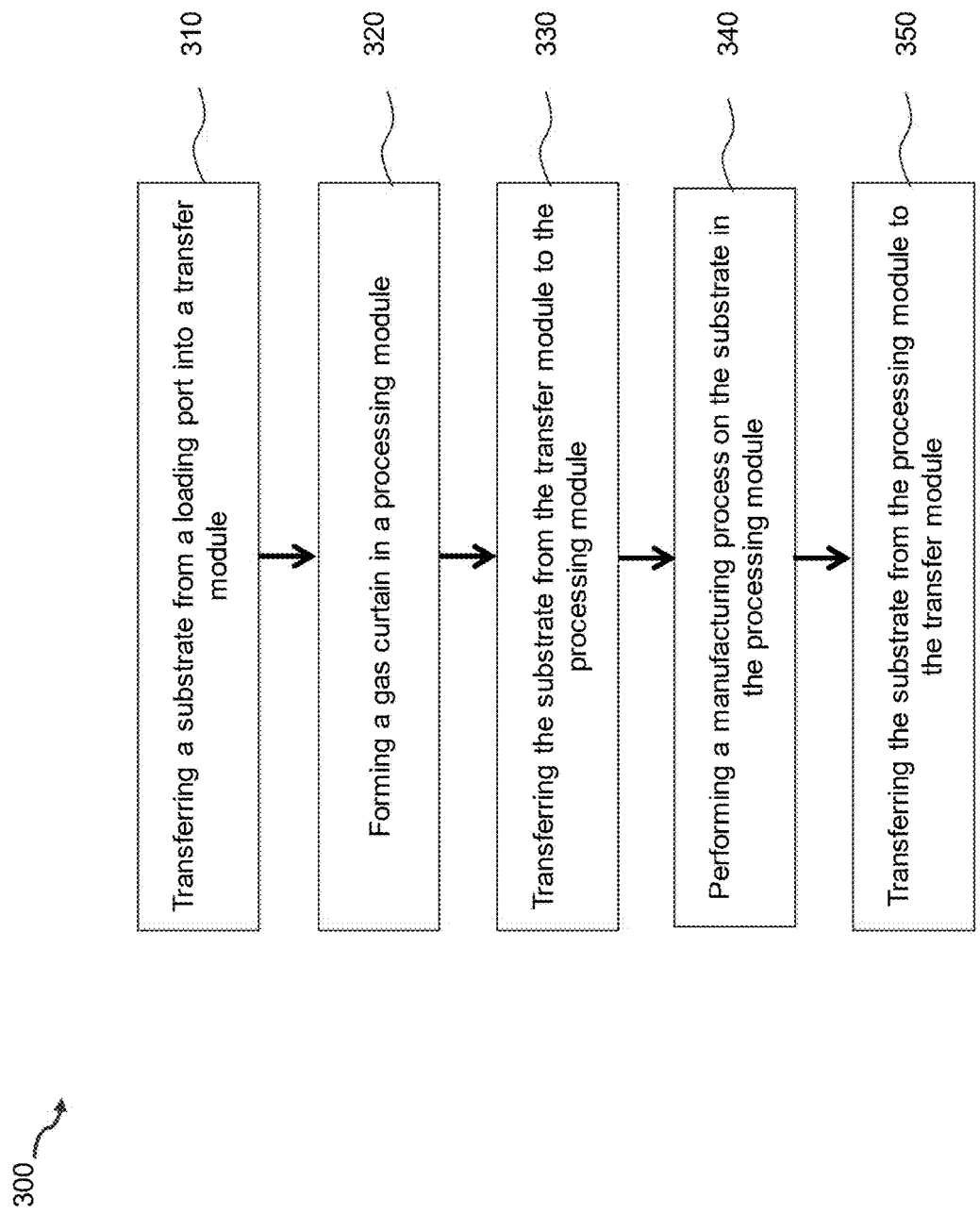
FIG. 3 is a flow chart of a method for operating a semiconductor device manufacturing system, according to some embodiments.

FIG. 3 is a method 300 for operating a semiconductor device manufacturing system as described with reference to FIGS. 1 and 2, according to some embodiments. This disclosure is not limited to this operational description. It is to be appreciated that additional operations may be performed. Moreover, not all operations may be needed to perform the disclosure provided herein. Further, some of the operations may be performed simultaneously or in a different order than shown in FIG. 3. In some implementations, one or more other operations may be performed in addition to or in place of the presently described operations. For illustrative purposes, method 300 is described with reference to FIGS. 1 and 2. However, method 300 is not limited to these embodiments.

In operation 310, a substrate is transferred from a loading port to a transfer module of the semiconductor device manufacturing system. For example, referring to FIG. 1, a substrate can be transferred from loading port 107 to transfer module 105. The substrate transfer operation can include withdrawing the substrate from substrate storage device 108 and transferring the substrate from loading port 107 to transfer module 105. In some embodiments, the substrate transfer operation between loading port 107 to transfer module 105 can include transferring the substrate from loading port 107 by robotic arm 113 to wafer orientation stage 115. In some embodiments, the substrate transfer operation between loading port 107 and transfer module 105 can include purging an inert gas (e.g., nitrogen gas) in transfer module 105 to reduce an oxygen/moisture level in transfer module 105. In some embodiments, transfer module 105 can initially be in a vacuum environment prior to the operation of the semiconductor device manufacturing system, where the substrate transfer operation between loading port 107 and transfer module 105 can include venting transfer module 105 to atmospheric pressure (e.g., 760 mtorr).

In referring to FIG. 3, in operation 320, a gas curtain is formed in a processing module of the semiconductor device manufacturing system. The gas curtain can be a directional and localized inert gas flow that blocks a residue gas (e.g., oxygen or moisture) from entering the processing module. For example, referring to FIG. 2, gas curtain 243 can be formed in processing chamber 202 to block inflow 241 from entering processing chamber 202. In some embodiments, gas curtain 243 can be formed between processing chamber 202 and transfer module 105. In some embodiments, gas curtain 243 can be formed adjacent to slit valve 217. In some embodiments, the gas curtain can be formed away from slit valve 217 (e.g., at or adjacent to the processing chamber 202's rear side 233). The process for forming gas curtain 243 can include generating localized inert gas streams (e.g., nitrogen or argon) by gas curtain device 220. In some embodiments, the inert gas stream can be generated by directionally (e.g., in a z-direction) flowing the inert gas from processing chamber 202's bottom portion sidewall 203 towards processing chamber 202's top portion sidewall 205. In some embodiments, the inert gas stream can be generated by flowing the inert gas from processing chamber 202 towards the transfer module 105. In some embodiments, the inert gas stream can be generated to flow the inert gas towards slit valve 217. In some embodiments, to allow gas curtain 243 to effectively block residue gas from flowing into processing chamber 202, the inert gas stream can be generated by directionally flowing the inert gas through tilted gas conduits $222_1$ and $222_2$, where gas conduits' outlets $225_1$ and $225_2$ can tilt towards slit valve 217 and/or transfer module 105. In some embodiments, to allow gas curtain 243 to effectively block residue gas from entering processing chamber 202, the inert gas stream can be generated to flow the inert gas beyond a threshold flow rate, such as equal to or larger than about 1 slm, equal to or larger than about 5 slm, equal to or larger than about 10 slm, equal to or larger than about 20 slm, equal to or larger than about 50 slm. In some embodiments, the process for forming gas curtain 243 can further include closing processing chamber 202's gas outlet port 122A (e.g., by closing valve 254) to avoid gas curtain 243 flowing towards the gas outlet port. In some embodiments, the process for forming gas curtain 243 can include reducing a gas exhaust rate from processing chamber 202's gas outlet port 122A by controlling a gas flow meter (not shown in FIG. 2) of gas extraction system 210.

In referring to FIG. 3, in operation 330, the substrate is transferred from the transfer module to a processing module. For example, referring to FIG. 1, the substrate can be transferred from transfer module 105A to processing chamber 102A of processing module 101A. The transfer operation can include opening slit valve 117A, delivering the substrate from transfer module 105 to processing chamber 102A using robotic arm 113, and closing slit valve 117A. In some embodiments, in referring to FIG. 2, slit valve 217 can be opened concurrently as forming gas curtain 243 in processing chamber 202. In some embodiments, gas curtain 243 can be formed after opening slit valve 117A. The delivery of the substrate from transfer module 105 to processing chamber 102 can be performed after forming gas curtain 243. For example, the delivery of the substrate can be performed after a time delay (e.g., 5 seconds) after forming gas curtain 243. In some embodiments, the time delay can be determined based on a residue gas (e.g., oxygen; moisture) level detected by gas detector 214. As a result, the delivery of the substrate from transfer module 105 to processing chamber 102 can include delivering the substrate through gas curtain 243. After closing slit valve 117A, the gas curtains can be disabled. In some embodiments, after closing slit valve 117A, processing chamber 102A can be purged by a processing gas for subsequent manufacturing processes. In some embodiments, after closing slit valve 117A, processing chamber 102A can be pumped down to a vacuum pressure level for subsequent semiconductor manufacturing processes.

In referring to FIG. 3, in operation 340, one or more semiconductor manufacturing processes are performed on the wafer in the processing module. For example, referring to FIG. 1, one or more semiconductor manufacturing processes can be performed on the substrate in processing chamber 102A. The one or more semiconductor manufacturing procedures can include deposition processes, such as MBE, CVD, PECVD, LPCVD, ECD, PVD, ALD, MOCVD, sputtering, thermal evaporation, e-beam evaporation, or other deposition processes; etching processes, such as dry etching, RIE, ICP, and ion milling; thermal process such as RTA; microscopy, such as SEM, and TEM; or any combination thereof. In some embodiments, a high vacuum (e.g., between about 1 mtorr and about 10 mtorr) is established within processing chamber 102A during the one or more manufacturing processes.

In referring to FIG. 3, in operation 350, the processed substrate is transferred from the processing module to the transfer module. For example, referring to FIG. 1, the processed substrate can be transferred from processing chamber 102A to transfer module 105. The transfer operation can include opening slit valve 117A, transferring the substrate from processing chamber 102A to transfer module 105 using robotic arm 113, and closing slit valve 117A. In some embodiments, prior to opening slit valve 117A, the transfer operation can further include matching the pressure in processing chamber 102A with that in transfer module 105.

Figure 4:
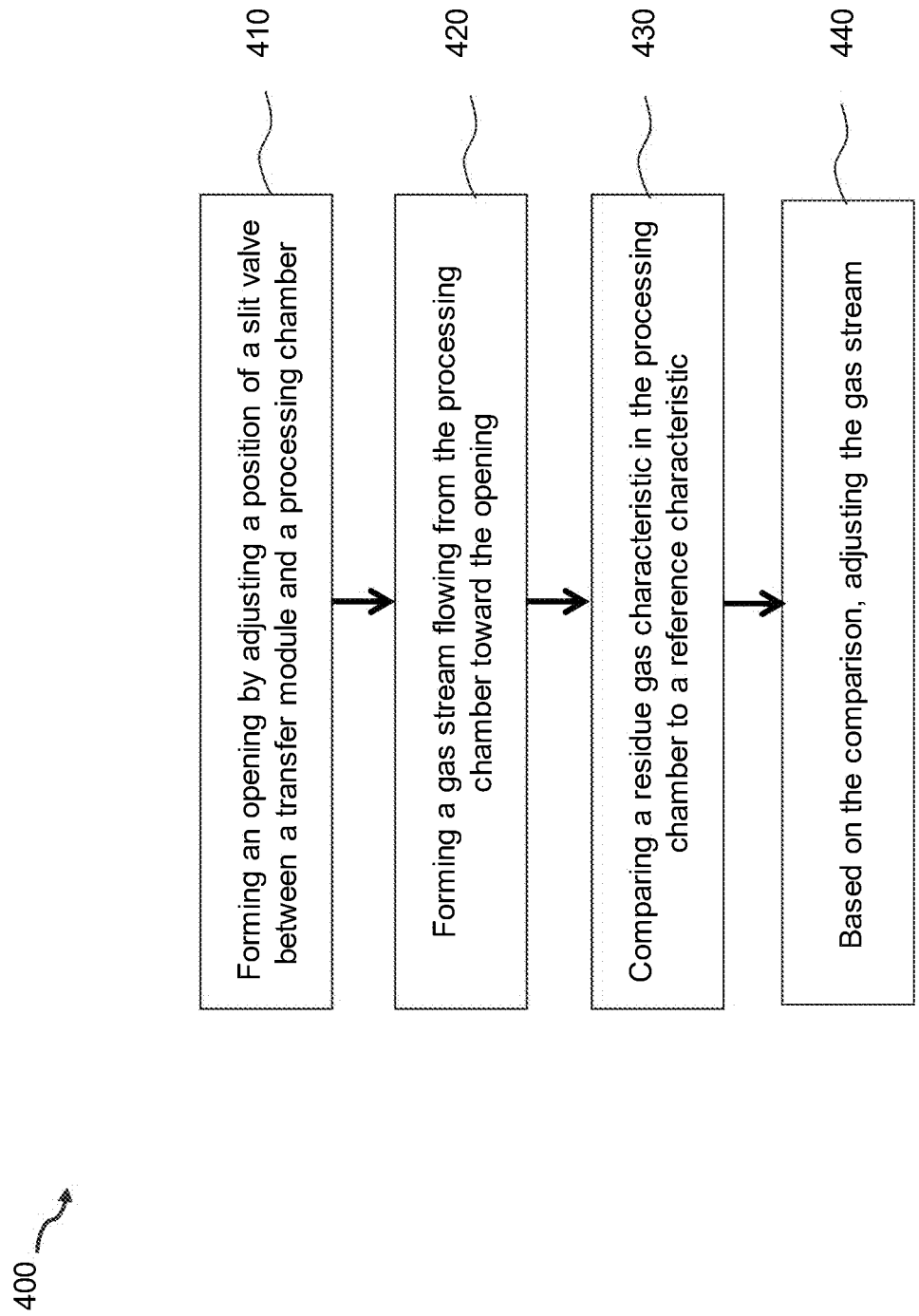
FIG. 4 is a flow chart of a method for operating a semiconductor device manufacturing system, according to some embodiments.

FIG. 4 is a method 400 for gas curtain in a semiconductor device manufacturing system as described with reference to FIGS. 1 and 2, according to some embodiments. Operations shown in method 400 can be an embodiment of operations 320 and 330 in method 300. This disclosure is not limited to this operational description. It is to be appreciated that additional operations may be performed. For example, one or more operations described in method 300 can be added or inserted between any operations described in method 400. Moreover, not all operations may be needed to perform the disclosure provided herein. Further, some of the operations may be performed simultaneously or in a different order than shown in FIG. 4. In some implementations, one or more other operations may be performed in addition to or in place of the presently described operations. For illustrative purposes, method 400 is described with reference to FIGS. 1 and 2. However, method 400 is not limited to these embodiments.

Method 400 begins with operation 410, where an opening is formed between a transfer module and a processing chamber by adjusting a position of a slit valve. For example, in referring to FIG. 2, slit valve 217, placed between transfer module 105 and processing chamber 202, can be adjusted to move vertically (e.g., along direction 235; ±z-direction) to form space 215 between transfer module 105 and processing chamber 202. Such space 215 can allow a substrate being transfer between transfer module 105 and processing chamber 202. In some embodiments, space 215 can enable residue gas inflow 241 to flow from transfer module 105 towards processing chamber 202.

Referring to FIG. 4, in operation 420, a gas stream is formed flowing from the processing chamber towards the opening. For example, in referring to FIG. 2, gas curtain 243 is formed flowing from processing chamber 202 towards space 215. As a result, the gas stream (e.g., gas curtain 243) can flow against inflow 241, thus blocking inflow 241 from entering into processing chamber 202. The gas stream can be formed by purging an inert gas in processing chamber 202 via a gas curtain device at a flow rate larger than a threshold (e.g., 1.0 slm). In some embodiments, the gas stream can be formed by flowing the inert gas from processing chambers 202's bottom portion sidewall 203 towards processing chamber 202's top portion sidewall 205. In other words, the gas stream can be formed by flowing the inert gas from a lower portion of space 215 towards an upper portion of space 215. In some embodiments, the gas stream can be formed by concurrently flowing inert gas in multiple positions (e.g., adjacent to slit valve 217 and/or rear side 233) in processing chamber 202. In some embodiments, slit valve 217 can be opened concurrently with forming gas curtain 243. In some embodiments, the one or more processes for forming the gas stream (e.g., gas curtain) are described above with respect to FIGS. 1 and 2 and operation 320.

Referring to FIG. 4, in operation 430, a residue gas level associated in the processing chamber is compared to a reference characteristic. The residue gas level can be detected, for example, by gas detector 214. The reference characteristic can be a pre-determined residue gas trace. Such reference characteristic can be associated with a desired manufacturing yield target or a required manufacturing reliability metric. For example, the reference characteristic can be an upper limit of oxygen trace in processing chamber 202 configured to conduct a RTA process. In response to an oxygen trace level below the reference characteristic, an unintentional oxidation accompanied by the RTA processes can be minimal, thus ensuring the variation of the resulting device performance is within a desired range. The comparison between the processing chamber's residue gas level and the reference characteristic can include measuring a concentration of residue gas (e.g., oxygen or moisture) in the processing chamber and subtracting the measured residue gas concentration from the reference characteristic. In some embodiments, the comparison can include subtracting an average residue gas concentration (e.g., an average residue gas through multiple locations of the processing chamber; or an average residue gas within a period of time) of the reference characteristic.

Referring to FIG. 4, in operation 440, the gas curtain is adjusted based on the comparison of the residue gas characteristic to the reference characteristic. As discussed above, the residue gas inflow can be blocked or reduced by the gas curtain. As a result, in response to the residue gas level in the processing chamber being above the reference characteristic, the adjustment can be made, which includes increasing the strength of the gas curtain and/or increasing the time of flowing the gas curtain. In some embodiments, the gas curtain's strength can be adjusted by (i) increasing the inert gas flow rate associated with the gas stream (e.g., the gas curtain discussed in operation 430), and (ii) decreasing a pumping rate associated with the processing chamber's exhaust port. For example, in referring to FIG. 2, valve 254 can be closed to avoid the generated gas stream leaking towards gas outlet port 122A, thus focusing gas curtain 243 flowing towards slit valve 217 to block inflow 241. In some embodiments, the pumping rate associated with gas outlet port 122A can be decreased by controlling a gas flow controller (not shown in FIG. 2) in gas extraction system 210.

After operation 430, the semiconductor device manufacturing system can continue to conduct semiconductor manufacturing processes on the substrate, such as transferring and/or processing substrates as discussed in method 300.

Figure 5:
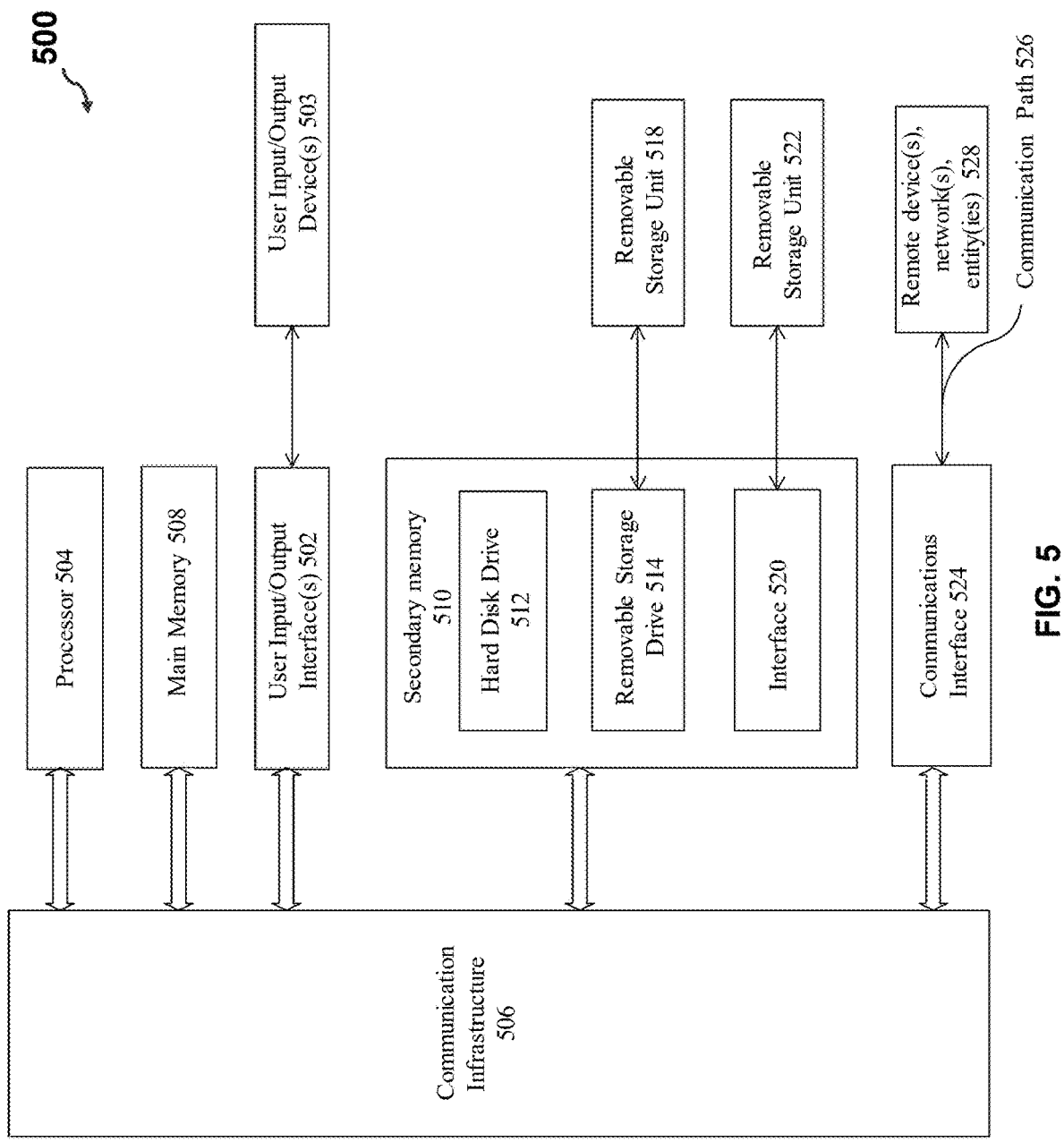
FIG. 5 illustrates a computer system, according to some embodiments.

FIG. 5 is an illustration of a computer system 500 in which various embodiments of the present disclosure can be implemented, according to some embodiments. Computer system 500 can be used, for example, in controller unit 170 of FIG. 1. Computer system 500 can be any well-known computer capable of performing the functions and operations described herein. For example, and without limitation, computer system 500 can be capable of processing and transmitting signals. Computer system 500 can be used, for example, to execute one or more operations of semiconductor device manufacturing system 100, method 300, and/or method 400.

Computer system 500 includes one or more processors (also called central processing units, or CPUs), such as a processor 504. Processor 504 is connected to a communication infrastructure or bus 506. Computer system 500 also includes input/output device(s) 503, such as monitors, keyboards, pointing devices, etc., that communicate with communication infrastructure or bus 506 through input/output interface(s) 502. A control tool can receive instructions to implement functions and operations described herein—e.g., the functions of semiconductor device manufacturing system 100 described in FIG. 1 and the method/process described in FIGS. 3 and 4—via input/output device(s) 503. Computer system 500 also includes a main or primary memory 508, such as random access memory (RAM). Main memory 508 can include one or more levels of cache. Main memory 508 has stored therein control logic (e.g., computer software) and/or data. In some embodiments, the control logic (e.g., computer software) and/or data can include one or more of the functions described above with respect to semiconductor device manufacturing system 100. In some embodiments, processor 504 can be configured to execute the control logic stored in main memory 508.

Computer system 500 can also include one or more secondary storage devices or memory 510. Secondary memory 510 can include, for example, a hard disk drive 512 and/or a removable storage device or drive 514. Removable storage drive 514 can be a floppy disk drive, a magnetic tape drive, a compact disk drive, an optical storage device, tape backup device, and/or any other storage device/drive.

Removable storage drive 514 can interact with a removable storage unit 518. Removable storage unit 518 includes a computer usable or readable storage device with computer software (control logic) and/or data stored thereon. Removable storage unit 518 can be a floppy disk, magnetic tape, compact disk, DVD, optical storage disk, and/any other computer data storage device. Removable storage drive 514 reads from and/or writes to removable storage unit 518 in a well-known manner.

According to some embodiments, secondary memory 510 can include other mechanisms, instrumentalities or other approaches for allowing computer programs and/or other instructions and/or data to be accessed by computer system 500. Such mechanisms, instrumentalities or other approaches can include, for example, a removable storage unit 522 and an interface 520. Examples of the removable storage unit 522 and the interface 520 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 510, removable storage unit 518, and/or removable storage unit 522 can include one or more of the functions described above with respect to the wet bench structure.

Computer system 500 can further include a communication or network interface 524. Communication interface 524 enables computer system 500 to communicate and interact with any combination of remote devices, remote networks, remote entities, etc. (individually and collectively referenced by reference number 528). For example, communication interface 524 can allow computer system 500 to communicate with remote devices 528 over communications path 526, which can be wired and/or wireless, and which can include any combination of LANs, WANs, the Internet, etc. Control logic and/or data can be transmitted to and from computer system 500 via communication path 526.

The functions/operations in the preceding embodiments can be implemented in a wide variety of configurations and architectures. Therefore, some or all of the operations in the preceding embodiments—e.g., the functions of semiconductor device manufacturing system 100 described in FIG. 1, the functions of semiconductor device manufacturing system 200 described in FIG. 2, and the methods/processes described in FIGS. 3 and 4—can be performed in hardware, in software or both. In some embodiments, a tangible apparatus or article of manufacture including a tangible computer useable or readable medium with control logic (software) stored thereon is also referred to herein as a computer program product or program storage device. This includes, but is not limited to, computer system 500, main memory 508, secondary memory 510 and removable storage units 518 and 522, as well as tangible articles of manufacture embodying any combination of the foregoing. Such control logic, when executed by one or more data processing devices (such as computer system 500), causes such data processing devices to operate as described herein. For example, the hardware/equipment can be connected to or be part of element 528 (remote device(s), network(s), entity (ies) 528) of computer system 500.

In some embodiments, an apparatus can include a chamber, a slit valve configured to provide access to the chamber, a chuck disposed in the chamber and configured to hold a substrate, and a gas curtain device disposed between the chuck and the slit valve and configured to flow an inert gas to form a gas curtain.

In some embodiments, a method can include loading a substrate into a transfer module of a semiconductor device manufacturing system, forming a gas curtain in a processing chamber of the semiconductor device manufacturing system to block a gas flow from the transfer module to the processing chamber, and transferring the substrate from the transfer module to the processing chamber.

In some embodiments, a method can include forming an opening by adjusting a position of a slit valve between a transfer module and a processing chamber, purging a gas stream from the processing chamber towards the opening, comparing a residue gas characteristic in the processing chamber to a baseline requirement, and adjusting a strength of the gas stream based on the comparison.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
   a processing chamber;
   a slit valve configured to provide access to the processing chamber;
   a chuck disposed in the processing chamber and configured to hold as substrate; and
   a gas curtain device disposed between the chuck and the slit valve and configured to form a directional inert gas stream flowing towards the slit valve, wherein a ratio of a distance between the slit valve and the gas curtain device and a distance between the slit valve and a rear sidewall of the processing chamber is between about 0.02 and about 1.

2. The apparatus of claim 1, wherein the gas curtain device comprises:
   a gas hole formed through a sidewall of the processing chamber; and
   a gas conduit comprising an outlet and connected to the gas hole, wherein the outlet tilts towards the slit valve.

3. The apparatus of claim 1, further comprising:
   a gas outlet port formed through a rear sidewall of the processing chamber and configured to vent the processing chamber; and
   an other gas curtain device disposed between the chuck and the gas outlet port.

4. The apparatus of claim 3, wherein the gas curtain device is further configured to increase a strength of the directional inert gas stream by reducing a gas extraction flow rate associated with the gas outlet port.

5. The apparatus of claim 3, wherein the gas curtain device is further configured to increase a strength of the directional inert gas stream by closing the gas outlet port.

6. The apparatus of claim 1, further comprising a gas detector configured to detect an oxygen trace or a moisture trace in the processing chamber.

7. The apparatus of claim 1, wherein the gas curtain device is further configured to form the directional inert gas stream flowing from a bottom portion of the processing chamber towards a top portion of the processing chamber.

8. An apparatus, comprising:
   a processing chamber comprising a chuck;
   a slit valve configured to provide access to the processing chamber;
   a transfer module configured to transfer a substrate to the processing chamber via the slit valve; and
   a gas curtain device disposed between the chuck and the slit valve and configured to form a directional inert gas stream flowing towards the slit valve to block a gas flow from the transfer module towards the processing chamber, wherein a ratio of a distance between the slit valve and the gas curtain device and a distance between the slit valve and a rear sidewall of the processing chamber is between about 0.02 and about 1.

9. The apparatus of claim 8, wherein the processing chamber is configured to receive a process gas and perform an annealing process with the process gas on the substrate.

10. The apparatus of claim 8, wherein the slit valve is further configured to purge a gas stream from the processing chamber towards the transfer module when the slit valve is at an open position.

11. The apparatus of claim 10, wherein the slit valve is further configured to purge the gas stream from the processing chamber towards the transfer module at a flow rate greater than or equal to about 1.0 slm.

12. The apparatus of claim 8, further comprising a gas detector configured to detect a residue gas characteristic in the processing chamber, wherein the gas curtain device is further configured to adjust a strength of the directional inert gas stream based on a comparison of the residue gas characteristic to a baseline requirement.

13. An apparatus, comprising:
a processing chamber comprising a chuck;
a transfer module configured to transfer a substrate to the processing chamber via a slit valve disposed between the transfer module and the processing chamber;
a gas detector configured to detect a residue gas characteristic in the processing chamber; and
a gas curtain device disposed between the chuck and the slit configured to form a gas curtain by flowing a gas towards the slit valve, and adjust a strength of the gas curtain based on a comparison of the residue gas characteristic to a baseline requirement, wherein a ratio of a distance between the slit valve and the gas curtain device and a distance between the slit valve and a rear sidewall of the processing chamber is between about 0.02 and about 1.

14. The apparatus of claim 13, wherein the gas detector is further configured to detect the residue gas characteristic by measuring a concentration of oxygen or moisture in the processing chamber.

15. The apparatus of claim 13, wherein the gas curtain device is further configured to adjust the strength of the gas curtain by increasing a flow rate associated with the gas curtain.

16. The apparatus of claim 13, further comprising an other gas curtain device disposed between the chuck and a gas outlet port and configured to form another gas curtain by flowing the gas towards the chuck.

17. The apparatus of claim 8, wherein the gas curtain device comprises a gas conduit with an outlet that tilts towards the slit valve.

18. The apparatus of claim 13, wherein the gas curtain device comprises:
a first gas conduit disposed between a first end of the chuck and the slit valve, wherein the first gas conduit comprises a first outlet that tilts towards the slit valve;
a gas outlet port disposed on an end of the processing chamber opposite to that of the slit valve; and
a second gas conduit disposed between a second end of the chuck and the gas outlet port, wherein the second gas conduit comprises a second outlet that tilts towards the slit valve, and wherein the second end is opposite to the first end of the chuck.

19. The apparatus of claim 2, wherein an opening of the gas conduit is greater than or equal to about 3 mm.

20. The apparatus of claim 8, wherein the gas curtain device comprises a gas conduit with an opening greater than or equal to about 3 mm.

* * * * *